(12) United States Patent
Dwyer et al.

(10) Patent No.: US 10,519,035 B1
(45) Date of Patent: Dec. 31, 2019

(54) COVALENT CHEMICAL SURFACE MODIFICATION OF SURFACES WITH AVAILABLE SILICON OR NITROGEN

(71) Applicant: Rhode Island Council on Postsecondary Education, Warwick, RI (US)

(72) Inventors: Jason R. Dwyer, Providence, RI (US); Y. M. Nuwan D. Y. Bandara, Kingston, RI (US); Buddini Iroshika Karawdeniya, Kingston, RI (US); Julie C. Whelan, Shannock, RI (US)

(73) Assignee: Rhode Island Council On Postsecondary Education, Warwick, RI (US)

( * ) Notice: Subject to any disclaimer, the term of this patent is extended or adjusted under 35 U.S.C. 154(b) by 12 days.

(21) Appl. No.: 15/900,762

(22) Filed: Feb. 20, 2018

Related U.S. Application Data

(60) Provisional application No. 62/462,583, filed on Feb. 23, 2017.

(51) Int. Cl.
| | | |
|---|---|---|
| *H01L 21/02* | (2006.01) | |
| *B81C 1/00* | (2006.01) | |
| *C25D 11/32* | (2006.01) | |

(52) U.S. Cl.
CPC ......... *B81C 1/00206* (2013.01); *C25D 11/32* (2013.01); *H01L 21/02118* (2013.01); *H01L 21/02258* (2013.01); *H01L 21/02307* (2013.01); *H01L 21/02321* (2013.01); *H01L 21/02359* (2013.01); *Y10S 977/893* (2013.01)

(58) Field of Classification Search
CPC ......... H01L 21/02118; H01L 21/02255; H01L 21/02258; H01L 21/02285; H01L 21/02307; H01L 21/02321; H01L 21/02345; H01L 21/02359; B81C 1/00087; B81C 1/00206; C25D 11/32; Y10S 977/893; Y10S 977/899; Y10S 977/924
See application file for complete search history.

(56) References Cited

U.S. PATENT DOCUMENTS

| | | | | |
|---|---|---|---|---|
| 9,057,693 | B2 * | 6/2015 | Astier | ............... G01N 27/4473 |
| 2008/0254995 | A1 * | 10/2008 | Kim | ...................... B82Y 30/00 |
| | | | | 506/4 |
| 2011/0232794 | A1 * | 9/2011 | Nakatani | ................. B01F 5/061 |
| | | | | 138/103 |

(Continued)

OTHER PUBLICATIONS

Kwok H, et al. "Nanopore Fabrication by Controlled Dielectric Breakdown," PLoS One 9(3): e92880 (2014).

(Continued)

*Primary Examiner* — Stephen W Smoot
(74) *Attorney, Agent, or Firm* — Milstein Zhang & Wu LLC; Duan Wu, Esq.

(57) ABSTRACT

The invention provides a method to form and functionalize monolayers on a silicon-rich silicon nitride surface or a silicon surface formed by a nanopore fabrication method known as dielectric breakdown. Thermal, photochemical and radical processing can be used to hydrosilylate nascent silicon and silicon nitride surfaces with various reagents. The conventional need for hydrofluoric acid etching prior to coupling functional groups to the surfaces is thereby completely avoided.

26 Claims, 14 Drawing Sheets

(56) References Cited

U.S. PATENT DOCUMENTS

| | | | |
|---|---|---|---|
| 2013/0095999 A1* | 4/2013 | Chaikittisilp | B01J 20/3278 |
| | | | 502/402 |
| 2016/0115531 A1* | 4/2016 | Huber | C12Q 1/6869 |
| | | | 506/4 |
| 2017/0315109 A1* | 11/2017 | Alden | G01N 33/54366 |
| 2019/0120817 A1* | 4/2019 | Anderson | G01N 33/48721 |

OTHER PUBLICATIONS

Frament C et al. "Nanopore Surface Coating Delivers Nanopore Size and Shape through Conductance-Based Sizing," ACS Appl. Mater. Interfaces (2013), 5: 9330-9337.
Thissen P et al. "Wet chemical surface functionalization of oxide-free silicon," Progress in Surface Science 87 (2012) 272-290.
Frament C et al. "Conductance-Based Determination of Solid-State Nanopore Size and Shape: An Exploration of Performance Limits," J. Phys. Chem. C (2012), 116: 23315-23321.
Rosso M et al. "Covalently Attached Organic Monolayers on SiC and SixN4 Surfaces: Formation Using UV Lights at Room Temperature," Langmuir (2009) 25: 2172-2180.
Arafat A et al. "Covalent Biofunctionalization of Silicon Nitride Surfaces," Langmuir (2007) 23: 6233-6244.
Arafat A et al. "Tailor-Made Functionalization of Silicon Nitride Surfaces," J. Am. Chem. Soc. (2004) 126: 8600-8601.
Buriak J "Organometallic Chemistry on Silicon and Germanium Surfaces," Chemical Reviews, (2002), vol. 102, No. 5: 1272-1308.

* cited by examiner

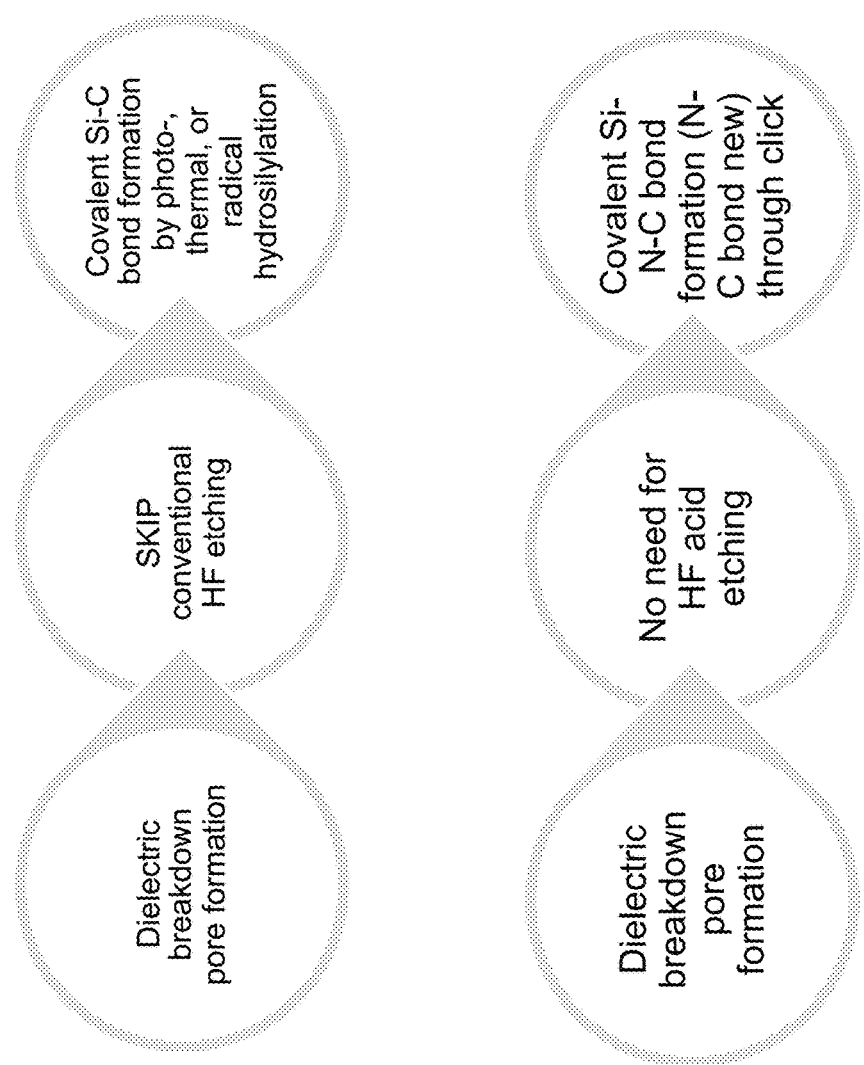

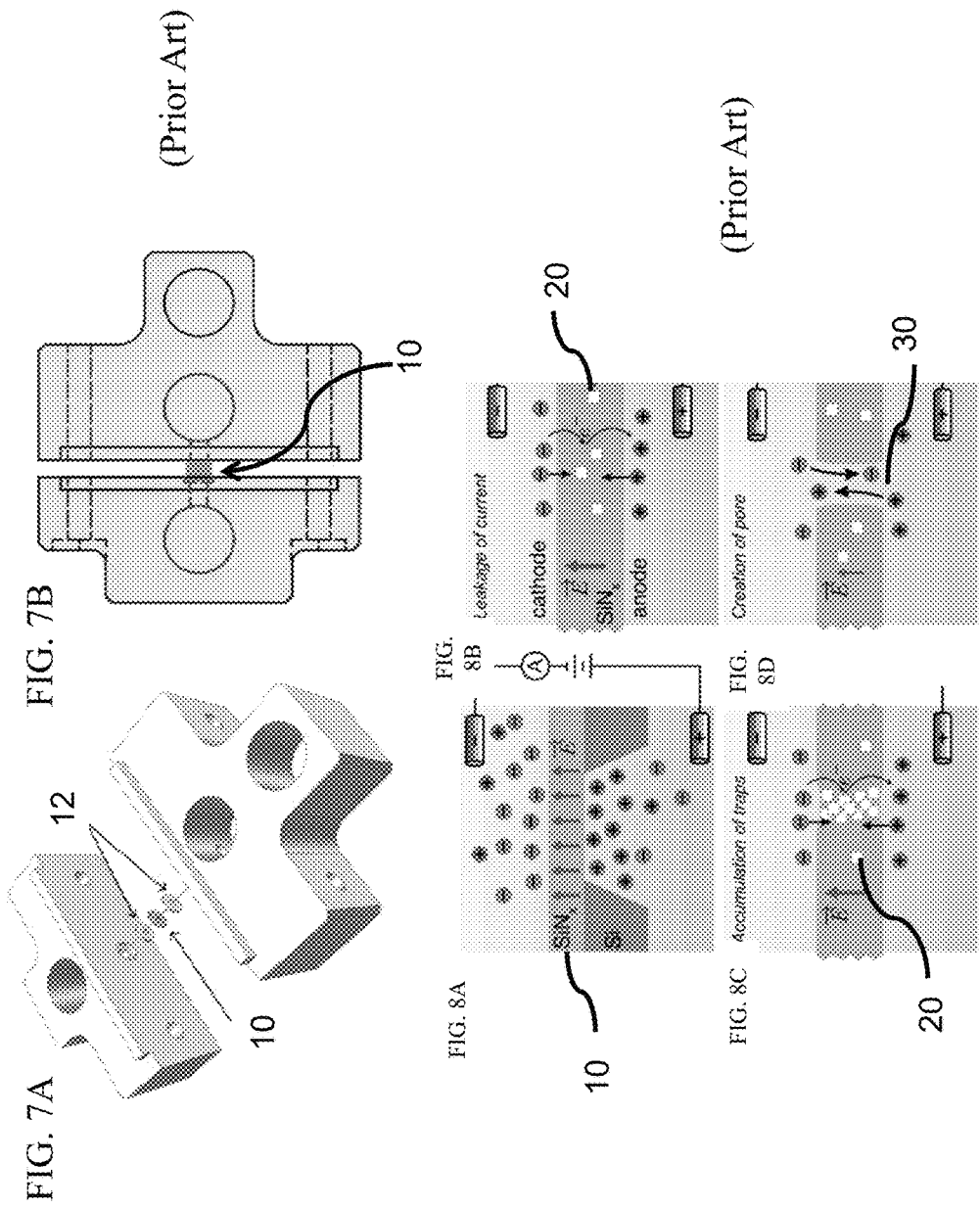

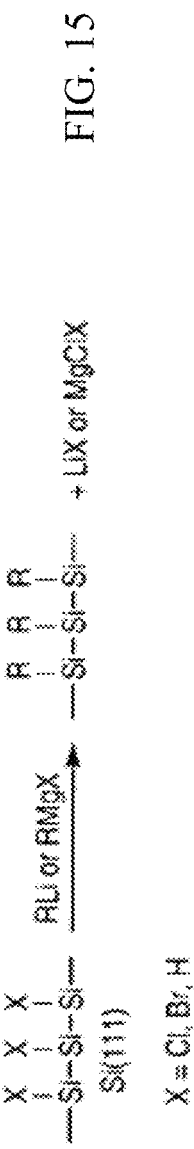
FIG. 15
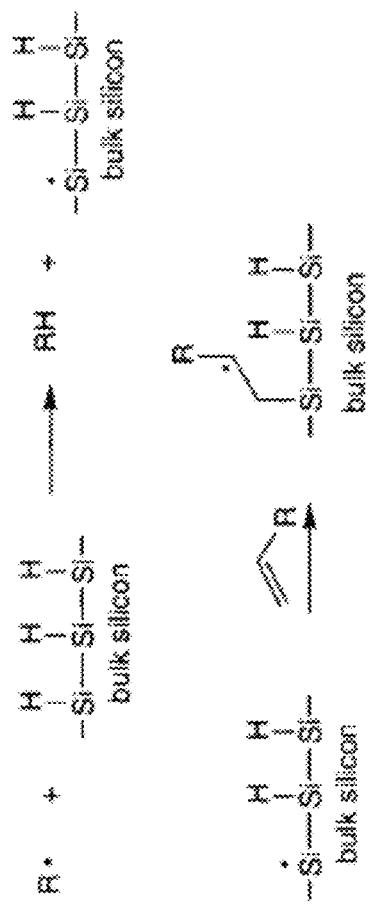
FIG. 16A
FIG. 16B

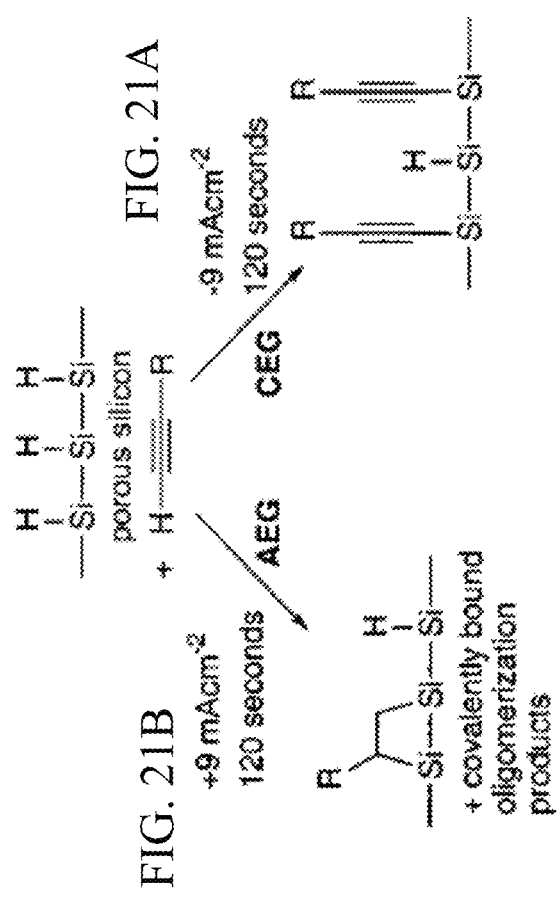

COVALENT CHEMICAL SURFACE MODIFICATION OF SURFACES WITH AVAILABLE SILICON OR NITROGEN

CROSS-REFERENCE TO RELATED APPLICATIONS

This application claims priority to and the benefit of U.S. provisional patent application Ser. No. 62/462,583, filed Feb. 23, 2017, which application is incorporated herein by reference in its entirety.

STATEMENT REGARDING FEDERALLY SPONSORED RESEARCH OR DEVELOPMENT

This Invention was made with government support under CBET1150085 awarded by the National Science Foundation. The government has certain rights in the invention.

BACKGROUND OF THE INVENTION

With the availability of newer and more reliable fabrication technologies, nanopore sensors (e.g., single molecule sensor) and nanoscale filters have rapidly become rising stars in many fields including biomedical diagnostics, and water quality monitoring and improvement. In order to detect and analyze minute amounts of analytes, in some cases, even a single biomolecule (DNA, RNA, protein and so on), nanopore sensors generally apply a voltage across a thin solid-state material (e.g., silicon-based membranes, and graphene) and/or a biological material (e.g., a lipid bilayer), and aims to detect when the ionic currents through nanometer-scale apertures are transiently changed by the translocation of, e.g., electrophoretically or otherwise driven biomolecules through the tiny apertures. For example, well built nanopore sensors can detect that the passage of RNA or single-stranded DNA molecules through a membrane-embedded alpha-hemolysin channel (1.5 nm in diameter) causes a ~90% blockage of the current when measured in a 1 M potassium chloride (KCl) solution.

Nanopore sensors find a wide range of applications in medicine, biological research, analytical chemistry, agriculture, food safety, environmental protection, fuel cell chemistry, and so on. For example, nanopore technology is promising the availability of much cheaper and faster DNA sequencing technology and new therapeutics for diabetic patients.

However, all nanopore sensing applications are challenged by limited control over surface chemistry as described in further detail below. Accordingly, there is a strong need for an easier, consumer-scale fabrication method to overcome the costly overhead and poor reliability issues that plague conventional silane chemistry.

SUMMARY OF THE INVENTION

The invention relates to a method to form and functionalize one or more layers (submonolayer, monolayers, bilayer, and so on) on silicon nitride and silicon surfaces that have been formed using a nanopore fabrication method known as "dielectric breakdown." In an exemplary embodiment, thermal, photochemical or radical processing is used to hydrosilylate nascent or otherwise available silicon and silicon nitride surfaces with an unsaturated organic compound, e.g., with 1-alkenes and/or 1-alkynes, resulting in coupling one or more functional groups to the silicon (Si) via a covalent bond (e.g., a Si—C bond), attaching a first layer (typically a monolayer) of functional groups. Judicious choice of terminal functional group(s) allows the layer to be subsequently reacted to further tune the monolayer, e.g., to improve filling/fractional coverage with bulky groups. By coupling to freshly formed, silicon-rich silicon nitride or silicon surfaces, the conventional need for hydrofluoric acid etching prior to coupling is avoided. Any monolayer coverage issues can then be addressed through coupling a second, bulkier layer to the first.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIGS. 6A and 6B illustrate steps in: a method embodiment according to the invention involving various ways for hydrosilylation (6A), and another method embodiment according to the invention (6B).

FIGS. 7A and 7B illustrate: a perspective view (7A), and a top view (7B) of an exemplary setup for practicing the invention.

FIGS. 8A-8D schematically illustrate how dielectric breakdown can be performed to form a nanopore: (8A) An electric field forms inside the chip; (8B) Free charges can result from redox reactions at the surface or by field ionization of incorporated ions; (8C) A highly localized conductive path forms; and (8D) A nanopore eventually forms.

FIG. 15 outlines a scheme for performing further surface chemistry on a Si(111) surface that has been functionalized according to an embodiment of the invention.

FIGS. 16A and 16B outline a mechanism for hydrosilylating a freshly formed, nanopore-containing silicon surface using radical initiators, according to an embodiment of the invention: (16A) production of R. radicals in the presence of diacylperoxide, which in turn, forms silicon radical; and (16B) reaction of the surface silicon radical with alkene to form an Si—C bond.

FIGS. 21A and 21B outline mechanisms for hydrosilylating a freshly formed, nanopore-containing silicon nitride surface using electrografting, according to an embodiment of the invention: (21A) Cathodic Electrografting (CEG); and (21B) Anodic Electrografting (AEG).

DETAILED DESCRIPTION OF THE INVENTION

Figure 2:
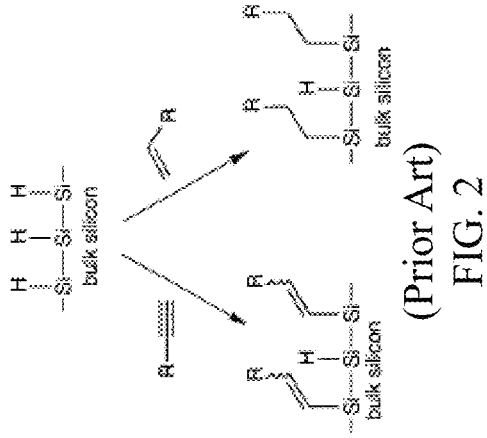
FIG. 2 schematically illustrates convention hydrosilylation technique on a hydrogen-terminated silicon surface after acid etching.

Unless otherwise noted, technical terms are used according to conventional usage.

As used in the specification and claims, the singular form "a", "an", or "the" includes plural references unless the context clearly dictates otherwise. For example, the term "a cell" includes a plurality of cells including mixtures thereof.

When a dimensional measurement is given for a part herein, the value is, unless explicitly stated or clear from the context, meant to describe an average for a necessary portion of the part, i.e., an average for the portion of the part that is needed for the stated purpose or function. Any accessory or excessive portion not necessary for the stated function is not meant to be included in the calculation of the value.

As used herein, the term "etching-free" or "HF-free" means non-use or avoidance of the conventional etching step that strips oxide coating from a silicon or silicon nitride substrate surface, said step normally using a liquid hydrofluoric acid (HF).

As used herein, the term "hydrosilylation," or "(catalytic) hydrosilation," refers to one of the most useful reactions that result in the formation of organsilanes and organosilicones, which have a variety of applications in industry and as intermediates in organic chemistry. Hydrosilylation occurs via the addition of H—Si to a terminal, unsaturated bond such as a carbon-carbon bond, carbon-oxygen bond, carbon-nitrogen bond, nitrogen-nitrogen bond and nitrogen-oxygen bond, usually using a metal catalyst, Lewis Acid, or radical initiator. The basic reaction can be described using the following exemplary scheme where an alkene, alkyne or another unsaturated carbon compound is activated to permit reaction with the Si—H surface:

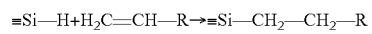

$$\equiv Si-H + H_2C=CH-R \rightarrow \equiv Si-CH_2-CH_2-R$$

A typical advantage of the hydrosilylation reaction, where it results in a covalent Si—C bond, is the formation of a thermodynamically and kinetically stable Self-Assembled Monolayer (SAM).

As used herein, the term "silicon nitride" refers to any chemical compound consisting substantially of two elements only: silicon and nitrogen, such that it can be chemically represented as $Si_xN_y$. The most thermodynamically stable amongst silicon nitride ($Si_xN_y$) is $Si_3N_4$. A "silicon-rich" silicon nitride, as used herein, refers to a silicon nitride ($Si_xN_y$) where the ratio of "x" over "y" is greater than 0.75, i.e., x:y>3:4, e.g., where "y" is 4, "x" can be 4, 5, 6, 8, or more. Other examples of "silicon-rich" Si/N ratio in silicon nitride include: 0.77, 0.82, 1.02, 0.95, 1.14, 0.87, and so on (see Journal of Vacuum Science & Technology A: Vacuum, Surfaces, and Films 14, 2879 (1996)). A silicon nitride substrate can be one or more layers of silicon nitride deposited on a semiconductor (e.g., silicon) base.

As used herein, the term "freshly formed," "nascent" or "pristine" refers to the state of a surface region that is void of significant oxide formation or other masking groups that would otherwise preclude substantive and intended chemical attachment to the underlying silicon or nitrogen atom(s). Accordingly, a "freshly formed" silicon surface or region has available silicon hydride (Si—H) at sufficient density for chemical attachment, e.g., by forming organsilanes and organosilicones via hydrosilylation (e.g., by forming covalent Si—C bonds on the surface or region). Similarly, a "freshly formed" silicon nitride surface or region has available silicon-nitrogen-hydride (Si—N—H) at sufficient density for chemical attachment (e.g., by forming covalent Si—N—C bonds on the surface or region). Some oxide formation on a "freshly formed" silicon or silicon nitride surface/region is allowed within the meaning of the present invention as long as the intended chemical attachment or functionalization reaction can proceed and result in successful and significant surface modification. In a preferred embodiment, a "freshly formed" silicon or silicon nitride surface/region is provided without the use of any etching (e.g., hydrofluoric acid) treatment to strip oxides on the surface or region—such a surface may be provided directly through the nanopore fabrication technique called "dielectric breakdown."

Figure 1:
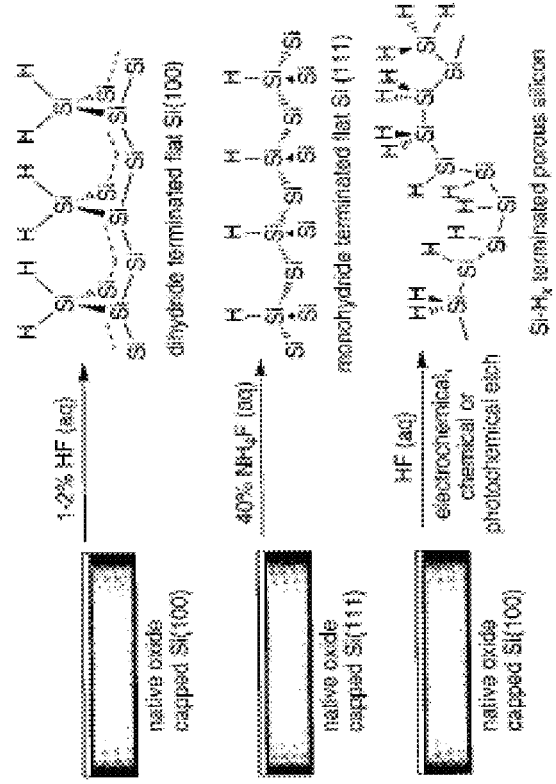
FIG. 1 illustrates conventional fluoride-based etching that lead to hydrogen-terminated flat and porous silicon surfaces in preparation of further surface functionalization.

Conventionally, surface functionalization chemistry is performed on both silicon surfaces and silicon nitride surfaces using the following silane chemistry: First, to form H-terminated Si surface free of the oxide coating, an acid such as the aqueous hydrofluoric acid (HF) is used to remove the oxide coating on silicon wafers. See, e.g., P. Thissen et al., *Prog. Surf Sci.* 2012, 87, 272-290 (Section 2.1). According to Buriak, J. M., *Chem. Rev.* 2002, 102, 1271-1308, commercial and native oxide-capped flat crystal silicon (100) wafers can be treated with dilute aqueous HF (1-2%) to arrive at a dihydride ($SiH_2$) surface as outlined in FIG. 1 (top). Then, after a Si—H surface has been obtained, and while remaining oxide-free, hydrosilylation chemistry can proceed where an unsaturated carbon compound, e.g., an alkyne or an alkene, reacts with an Si—H surface to form Si—C bond and an alkenyl or alkyl group, respectively (FIG. 2).

On silicon nitride surfaces, existing functionalization also relies on an initial HF treatment as the slightly higher than stoichiometric Si/N ratio is thought to direct the chemistry of $Si_3N_4$ towards the chemistry of silicon, e.g., H-termination by treatment with HF solutions and monolayer attachment. See, A. Arafat et al., *J. Am. Chem. Soc.* 2004, 126, 8600-8601. Prolonged exposure to HF leaves the nitride layer largely intact: almost complete removal of oxygen is observed. Specific examples of such HF treatment, often referred to as "etching," can be found in many references and is considered industrial standard. For example, in Rosso, M. et al., *Langmuir* 2009, 25, 2172-2180 (at 2173, right column under "Monolayer Formation"), the following etching procedure is described:

> The resulting oxidized surfaces were etched with a 2.5% solution of HF for 2 min. Right after this step, wafers were dipped into argon-saturated neat alkenes, in fused silica . . . or glass flasks.

Figure 3:
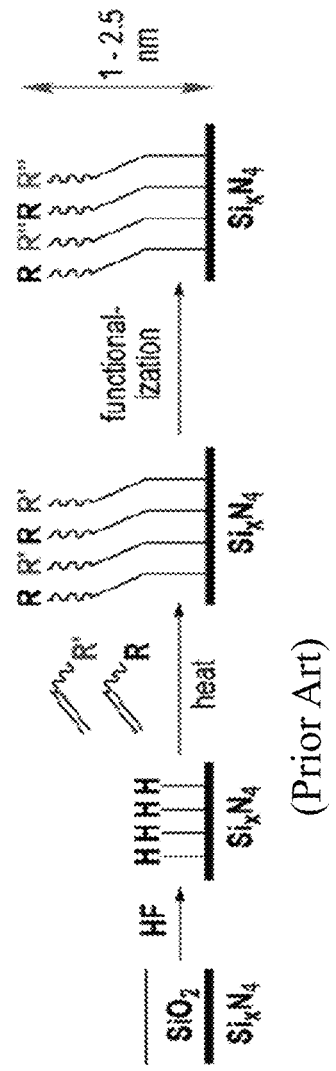
FIG. 3 schematically illustrates a conventional method for forming covalently attached organic monolayers onto $Si_xN_4$ surfaces where x>3, after HF-treatment.

After the HF treatment, functionalization of the silicon nitride surfaces can be conducted as illustrated in FIG. 3 (Arafat, A. et al., *Langmuir* 2007, 23, 6233-6244). For example, thermal attachment of functional group to the silicon nitride surfaces can be performed by "placing the wafer in refluxing solutions of 1-alkene or 1-alkyne (0.4 M) in mesitylene or in neat 1-alkene at 165° C." Supra, Arafat 2004, at 8600, right column. Photo-exposure can also be used to attach functional groups.

For silicon nitride surfaces, it has been noted in prior art references that surface chemistry of silicon-rich silicon nitride ($Si_xN_4$, where x>3) is expected to differ significantly from that of stoichiometric silicon nitride ($Si_3N_4$), which yields hydroxyl-covered surfaces upon etching with HF. Supra, Rosso.

Figure 4:
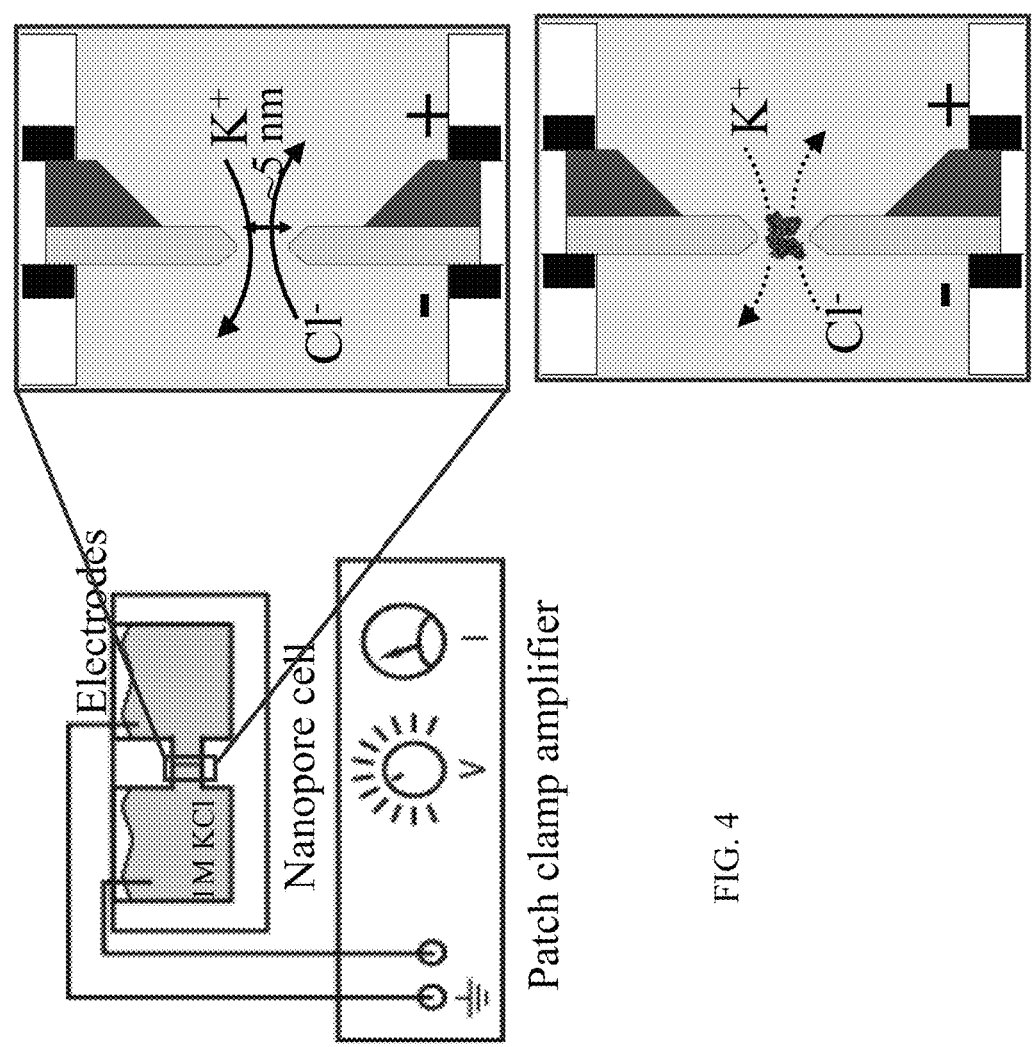
FIG. 4 schematically illustrates an exemplary nanopore sensor embodiment.

The problem with this standard HF etching procedure in connection with the manufacture of a nanopore sensor, however, is that such an etchant could strip away too many surface groups or too much of the surface to render the nanopore too large to function properly as a nano-scale sensor. As shown in FIG. 4, a typical nanopore in the sensor, for practicing the present invention, is about 3-5 nm in diameter at the narrowest point in its passageway, and in most cases, less than 50 nm, and preferably, less than 20 or even 10 nm, in order to conduct single molecule detection. In a preferred embodiment, the nanopore is about 3 nm, 2 nm or 1 nm in diameter. The HF soaking, however, tends to render the pore more than 100 nm wide with reasonable etching times, e.g., more than 15 or 30 seconds. According to the present invention, however, surfaces with available silicon, including silicon-rich silicon nitride surfaces and freshly formed silicon surface, can undergo additional covalent surface modification without the HF etching step, providing a solution for keeping the pore size within the desired range.

Figure 5:
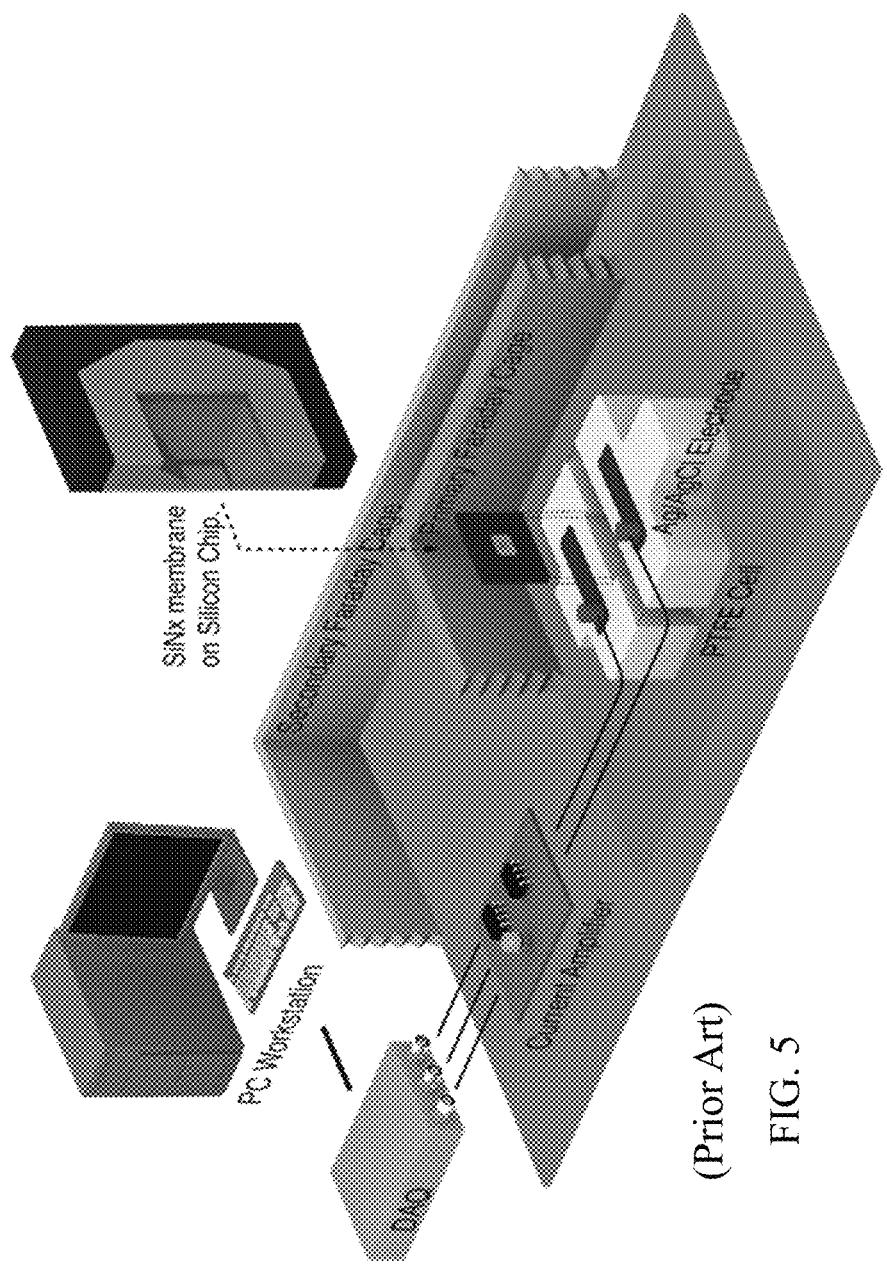
FIG. 5 illustrates an exemplary setup for making nanopores through computer-controlled dielectric breakdown technique. This setup is similar to instrumentation that is used to study biomolecules (e.g., nucleic acid or protein) translocation through nanopore.

According to principles of the present invention, controlled dielectric breakdown is performed to fabricate one or more nanopores, after which hydrosilylation or other attachment chemistry without the use of any surface etchant (e.g., HF), is successfully performed while freshly formed, silicon-rich silicon nitride or silicon surfaces are protected from extensive oxidation, e.g., by keeping them immersed in solution. An exemplary setup for dielectric breakdown is described in Kwok, H. et al., *PLoS ONE* 2014, 9, e92880 (see FIG. 5), and its entire disclosure is incorporated herein by reference. The substrate suitable for practicing dielectric breakdown should be less than about 100 nm, preferably about 10 nm, thick and therefore, is typically a thin-film substrate, e.g., a silicon nitride or silicon membrane about 10 nm thick and affixed to a much thicker base (e.g., a no less than 100 micrometer-thick, often 3 mm-diameter silicon base). In various embodiments, thermal or photochemical processing is used to hydrosilylate nascent silicon and silicon nitride surfaces with chemical reagents having at least one unsaturated bond, e.g., 1-alkenes and 1-alkynes, to form covalent, e.g., organic bonds with the underlying silicon (FIG. 6A). In another embodiment, a click reaction is carried out to attach a hydrophobic group to the underlying nitrogen atom through a Si—N—C covalent bond (FIG. 6B). Further, terminal functional group can be subsequently attached to tune the newly formed monolayer, e.g., to improve filling/fractional coverage with bulky groups, or change surface chemistry or nanopore diameter.

By directly coupling to freshly formed, silicon-rich silicon nitride or silicon surfaces, the conventional step for hydrofluoric acid etching prior to conducting the coupling chemistry is completely avoided, which eliminates the side effect of etching in terms of undesirably enlarging the nanopore. Any monolayer coverage issues can be addressed through coupling a second, bulkier layer to the first. Because the method provided by the present invention is solution-based, it is a perfect fit for nanofluidic applications.

Referring now to FIGS. 7A and 7B, in an illustrative embodiment, a silicon nitride transmission electron microscope (TEM) membrane 10 with a nominal thickness of 10 nm, and in turn, attached to a much thicker piece of silicon and together called a "chip," was mounted to a custom made liquid cell with gaskets 12 (2 mm inner diameter) on either side to ensure a watertight fit. See Trivedi, D. M. Fabrication and Characterization of Silicon Nitride Nanopores. The University of British Columbia, Vancouver, (2009). An aqueous electrolyte solution of 1 M potassium chloride (KCl) with pH ~7 was introduced to the cell, with attention paid to wetting the silicon nitride membrane. A range of solution conditions is compatible both for dielectric breakdown and subsequent surface functionalization by hydrosilylation. Ag/AgCl electrodes immersed on both sides of the membrane were connected to a resistive feedback current amplifier that allows electric potential up to ±20 V to be applied across the membrane.

Dielectric breakdown was carried out and controlled in solution using high electric fields in accordance with the procedure in Kwok, H. et al., supra, creating a single nanopore or fluidic channel ranging from about 1 to about 25 nm in the silicon nitride membrane. Schematically, an electric potential is applied across the silicon nitride membrane 10, resulting in an electric field inside the membrane and charges the interfaces with opposite ions (FIG. 8A). A tunneling mechanism guides leaking current through the membrane 10 with traps 20 (FIG. 8B). The number of charged traps (structural defects in the membrane) sets the magnitude of the observed leakage current. As charge traps 20 start to aggregate, bonds start to break, or energetic charges start to form a highly localized conductive passage and a discrete dielectric breakdown event (FIG. 8C). A nanopore 30 forms after the traps are removed (FIG. 8D).

After nanopore formation, according to an embodiment of the invention, the nanopore chip is removed from the dielectric breakdown electrolyte solution while keeping the nanopore under suitable solvent. In a preferred embodiment, the supporting electrolyte for dielectric breakdown was exchanged for water, and then ethanol (or other suitable organic solvent to keep the nanopore immersed in liquid).

The nanopore-containing chip was then transferred to a custom holder for surface functionalization while remaining submerged to minimize surface oxidation. No HF-etching step or other etchant is used to prepare the freshly formed nanopore surface for the initial chemical attachment reaction, e.g., a hydrosilylation reaction. This is possible only because the freshly formed silicon nitride surface resulting from the dielectric breakdown steps, in our estimation, provides a "silicon-rich" surface amenable for the ensuing functionalization steps envisioned for the present protocol. The omission of HF-etching is not obvious, as the use of HF to prepare a silicon- or silicon-nitride surface for hydrosilylation is standard practice widely followed by the semiconductor and nano-sensor industries. The use of HF etching is, moreover, undesirable because it removes too much material from the surface—in the case of a nanopore, HF processing makes the nanopore larger than desired.

Then, according to an embodiment of the invention, the nanopore surface is exposed to a 1-alkene or 1-alkyne of choice as a neat liquid, in solution, or as a vapor, and irradiated with UV light, e.g., at 254 nm, for a suitable length of time to form a covalently attached organic surface layer. The chip is then suitably rinsed and remounted in its Teflon cell under electrolyte solution. Moreover, a second or further chemical reaction can be carried out after the initial functionalization of the chip surface until desired terminal groups have been attached.

In other embodiments of the invention, various other types of surface chemistry are carried out on the freshly formed, silicon-rich silicon nitride or silicon nanopore surface in order to attach different functional groups to the nanopore surface, and in some cases, in more than one reactions and resulting in more than one layers.

Example 1

Figures 9A, 9B, 9C, 9D, 9E:
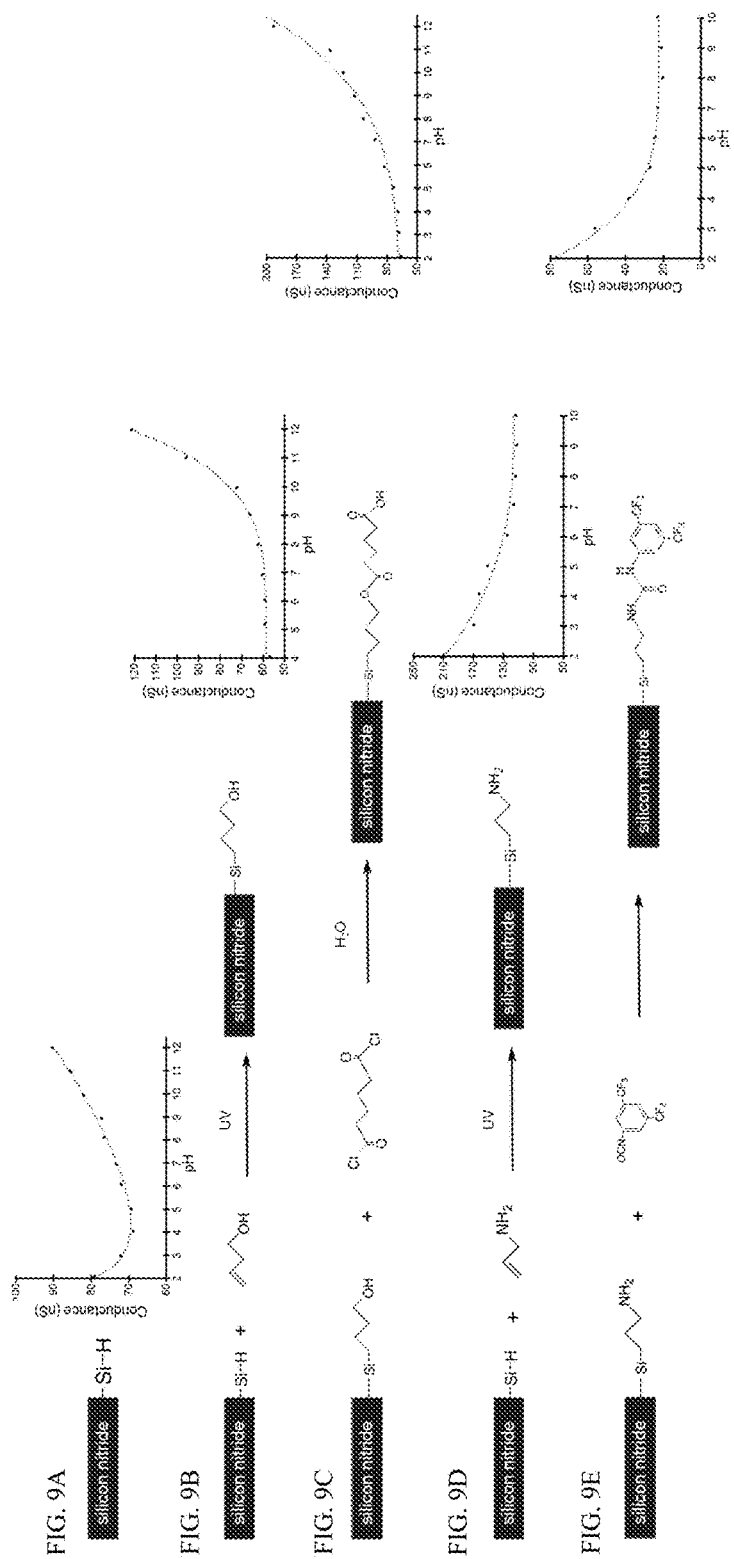
FIGS. 9A-9E illustrate schemes for performing surface functionalization according to embodiments of the present invention along with nanopore conductance plotted as a function of the pH of the surrounding electrolyte solution at each stage. Specifically, (9A) a freshly formed, silicon-rich silicon nitride surface before functionalization; (9B) the freshly formed, nanopore-containing surface is treated with 3-butene-1-ol and ultraviolet radiation; (9C) the hydrosilylated surface is further functionalized with adipoyl chloride, producing an extended terminal group (carboxylic acid) that is acidic; (9D) a freshly formed, silicon-rich silicon nitride surface is first treated with allylamine and UV radiation, and (9E) the hydrosilylated surface is further reacted with 3,5-bis(trifluoromethyl)phenyl isocyanate, producing an extended terminal group and an overall nanopore conductance consistent with basic surface termination. The respective progressions from (9B) to (9C), and (9D) to (9E) are not by hydrosilylation, but by reaction on a surface already functionalized by hydrosilylation. Traces in each of the graphs are theoretical fits made to raw data points.

Referring now to FIGS. 9A-9E, according to a preferred embodiment of the invention, soon after the formation of a nanopore in a silicon nitride chip via dielectric breakdown as described above (FIG. 9A), an aliquot of 20 µL of 3-butene-1-ol was added to the membrane side of the chip, sandwiched by a 2-inch long, 2-inch wide, and ¼-Inch Thick Quartz Plate and a metal holder and exposed to 15 W of 254 nm UV light for 3 hours (FIG. 9B). After the initial hydrosilylation, the same substrate having a nanopore, now with a presumptive organic monolayer, was subjected to a second chemical attachment reaction using adipoyl chloride (FIG. 9C), further expanding side group coverage.

According to another embodiment of the invention, freshly formed silicon-rich nanopore in a silicon nitride substrate underwent UV-mediated hydrosilylation with allylamine (FIG. 9D), followed by reaction with 3,5-bis(trifluoromethyl)phenyl isocyanate (FIG. 9E), completing a click addition.

After surface functionalization chemistry, the chips were subsequently washed with dichloromethane (DCM) and then with ethanol (or other suitable solvent to aid in subsequent wetting of the nanopore with electrolyte) and the nanopore-containing chips were remounted to be characterized.

Specifically, in order to probe and ascertain that intended surface chemistry indeed took place, measurements of the nanopore conductance (G), which is affected by the size and the surface chemistry of the nanopore, were taken. First, conductance measurements were plotted against its surrounding electrolyte solution's pH values. The resulting charts are presented in FIGS. 9A-9E. A literature-supported equation for the conductance of a surface-charged nanopore is:

$$G = K \cdot \frac{\pi r_0^2}{L} + \mu |\sigma| \cdot \frac{2\pi r_0}{L}$$

Where K is the solution conductivity, $r_0$ is the (cylindrical) nanopore radius, L is the (cylindrical) nanopore length, µ is the mobility of the solution counterion attracted to the charged nanopore surface, and σ is the surface charge density. For a surface terminated in a functional group that can undergo acid-base equilibrium reactions such as R—XH⇌R—X$^-$+H$^+$ or R R—YH+H$^+$, σ=σ(pH, pK$_a$). Accordingly, the measured nanopore conductance G is also a function of the solution's pH and the terminal group's pK$_a$. As shown in FIGS. 9A-9E, changes in the nanopore conductance curve (plotted against solution pH) are consistent with the anticipated surface chemical functionalization, as acidic end groups in FIGS. 9B and 9C affect the curve differently from the more basic end groups in FIGS. 9D and 9E.

Figure 10:
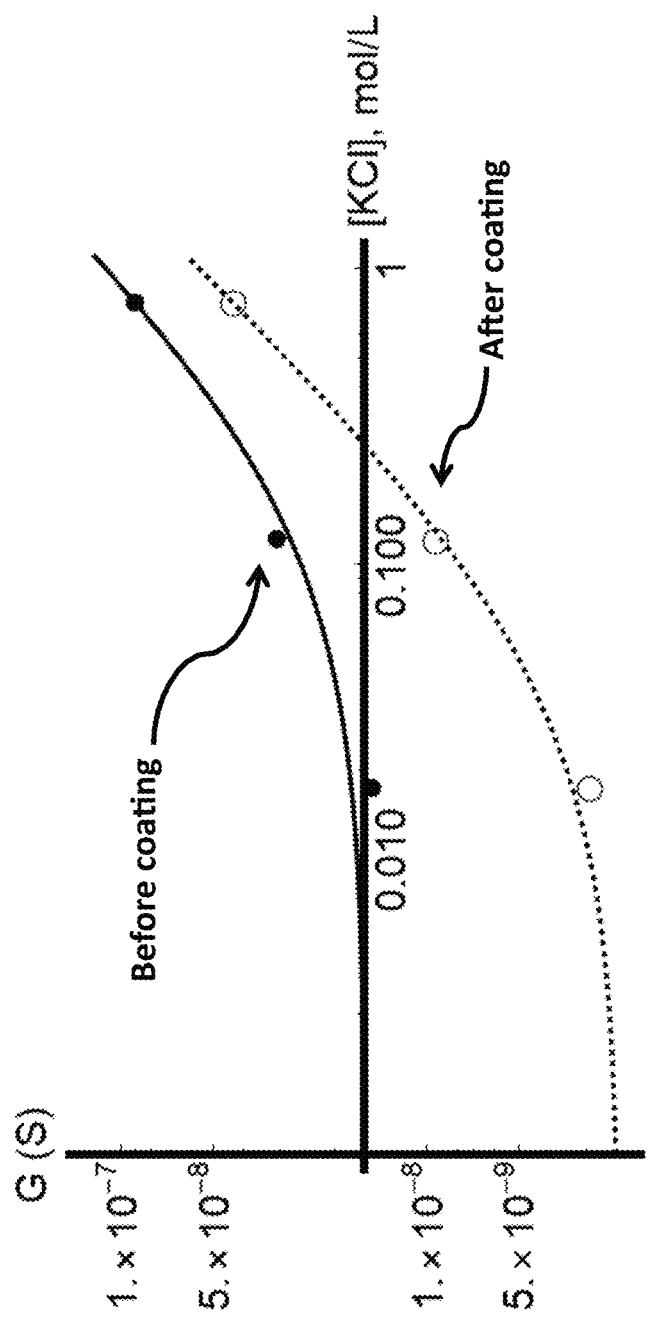
FIG. 10 graphically illustrates data that show the conductance of a nanopore as a function of solution electrolyte concentration before and after its surface was functionalized using a method according to the invention. Pore radii are inferred from the electrolyte-dependent conductance, using a simple model assuming a cylindrical pore shape. The surface chemical functionalization was carried out using the HF-free hydrosilylation reaction according to a preferred embodiment of the present invention.
Figure 11B:
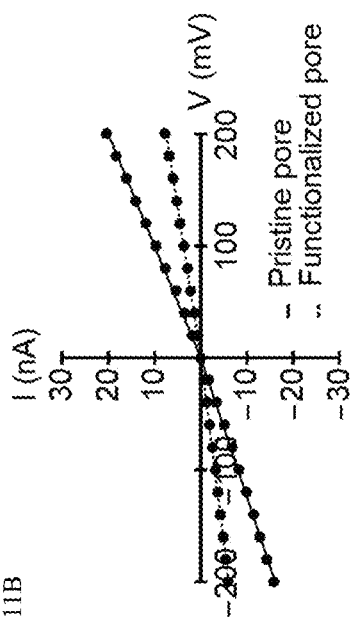
FIGS. 11A-11D graphically illustrate data that shows the current-voltage curves of nanopores before and after surface functionalization of the nanopores by photo-hydrosilylation using a method according to the invention: (11A)-(11D) each shows data obtained from four different samples, all undergoing the HF-free hydrosilylation with 3-butene-1-ol.
Figure 11A:
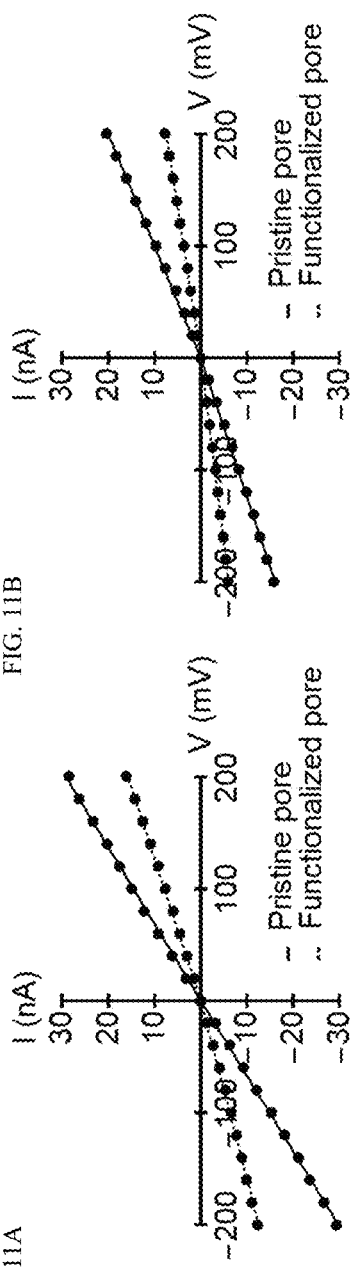
Figure 11D:
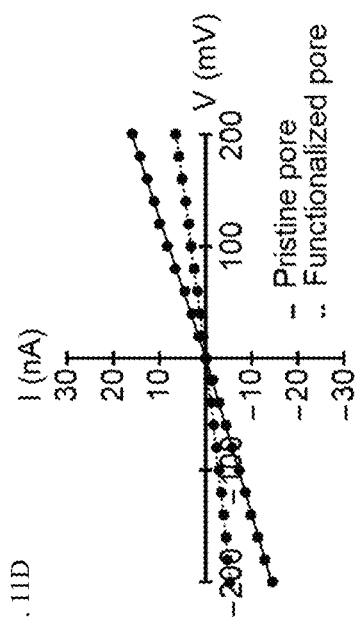
Figure 11C:
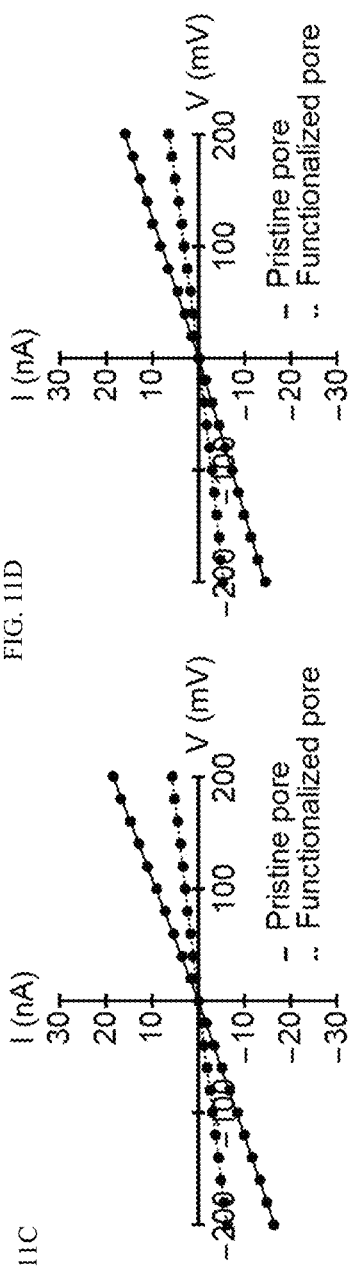

Second, measurements of nanopore conductance (G) were plotted against changing electrolyte concentrations surrounding the nanopore. Two resulting curves, representing measurements before and after surface functionalization using 3-butene-1-ol as described above are shown in FIG. 10. Conductance were measured in KCl buffered at pH 7 using 10 mM HEPES. The observation of significant drops in nanopore conductance measurements after the reaction at all tested electrolyte concentrations is consistent with the hypothesis of successful attachment of terminal groups to the nanopore surface, as a narrower passageway provides greater electric resistance. In the example presented in FIG. 10, assuming the nanopore was substantially of a cylindrical shape, its radius, calculated according to a method described in Frament, C. M. et al., *J. Phys. Chem. C* 2012, 116, 23315-23321, is 9.23 nm before coating (solid curve) and 6.63 nm after (dotted curve).

Third, changes brought by surface attachment chemistry in the slope of the current-voltage curve, which relates to nanopore conductance (G), were also plotted out. See, Frament, C. M. et al., *ACS Appl. Mater. Interfaces* 2013, 5, 9330-9337. Current-voltage (IV) curves of a nanopore measured in 1 M KCl at pH ~7 before and after surface functionalization with 3-butene-1-ol by photohydrosilylation, as outlined above, are shown in FIGS. 11A-11D.

Figure 12:
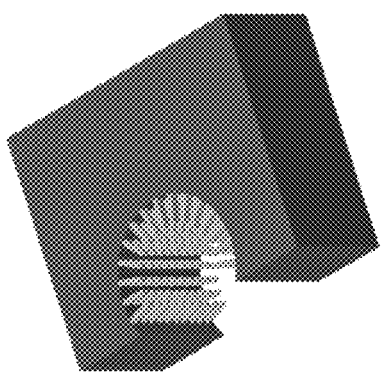
FIG. 12 illustrates how the wall surface lining the passageway of a freshly formed nanopore, freshly formed according to the invention, can be hydrosilylated without preparatory acid etching by covalently adding functional groups to the nascent silicon rich surface directly.

Based on measurements made before and after the surface functionalization, pore sizes were calculated according to methods described in Frament, et al. 2012, 2013, both supra; and Bandara, Y. M. N. D. Y. et all, *ACS Appl. Mater. Interfaces* 2016, 8, 30583-30589. The thickness of any attached layer on the nanopore surface, after surface functionalization using 3-butene-1-ol by photohydrosilylation, was calculated to be 0.70±0.1 nm (across 35 unique nanopores). IV curves of samples before and after the successful addition of 3-butene-1-ol with photoradiation show significant changes in the slope, as exemplified in FIGS. 11A-11D, confirming successful addition of functional groups to the nanopore surface along its passageway (FIG. 12).

In sum, the data support a conclusion of successful implementation of the HF-free hydrosilylation attachment reactions.

Example 2

Figure 13:
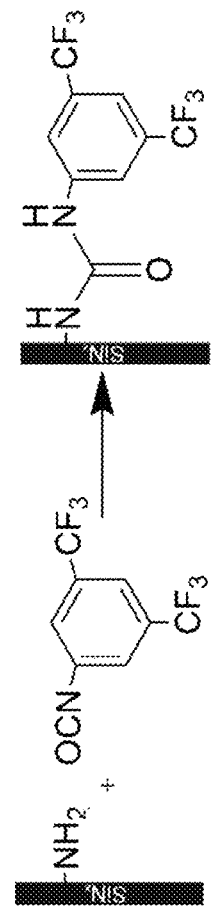
FIG. 13 illustrates a scheme for performing HF-free, surface functionalization using 3,5-bis(trifluoromethyl)phenyl isocyanate, through a click reaction, on a nascent silicon nitride surface according to an embodiment of the present invention.

Referring now to FIG. 13, according to an embodiment of the invention, click chemistry was used to covalently link an isocyanate-terminated species (e.g, 3,5-bis(trifluoromethyl) phenyl isocyanate) to an available Si—$NH_2$ (surface amine group) on the freshly formed silicon nitride surface. Specifically, in an example, after the fabrication of a nanopore in a silicon nitride chip via dielectric breakdown as described above, the freshly formed silicon-rich surface including the nanopore region was exposed to 3,5-bis(trifluoromethyl)phenyl isocyanate for 1 hour, resulting in the attachment of a highly hydrophobic terminal group. Afterwards, the functionalized pore was washed sequentially with DCM and ethanol.

Figure 14C:
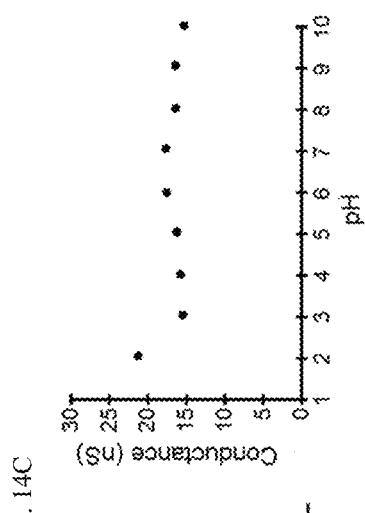
FIGS. 14A-14D graphically illustrate data that show: (14A) current-voltage curves of a nascent nanopore before (solid trace) and after (dotted trace, taken after overnight water soak) surface functionalization according to the scheme shown in FIG. 13; (14B) electric conductance across a nascent nanopore as a function of surrounding electrolyte solution's pH, same as in FIG. 9A (black trace is a fit made to raw data points using a theoretical function); (14C) pH-conductance data across the nanopore after being functionalized according to the scheme shown in FIG. 13; and (14D) a pH-conductance curve of a freshly fabricated silicon nitride nanopore treated with allyl amine (by hydrosilylation) and then with 3,5-bis(trifluoromethyl)phenyl isocyanate, same as the curve in FIG. 9E.
Figure 14B:
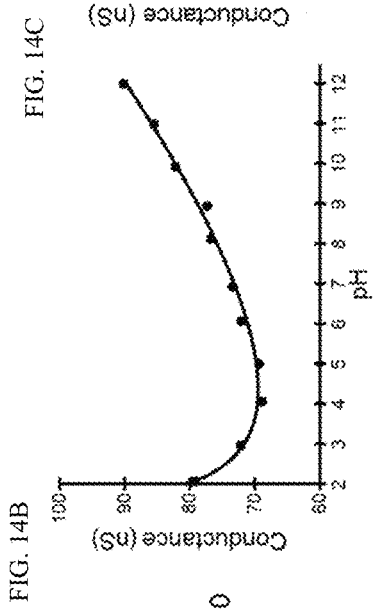
Figure 14D:
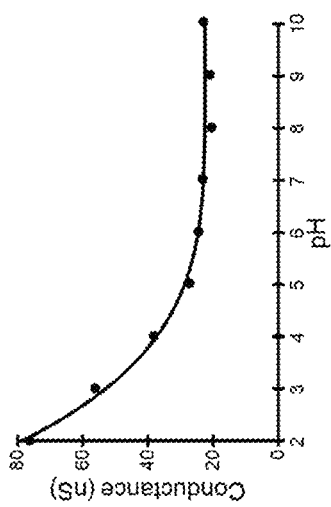
Figure 14A:
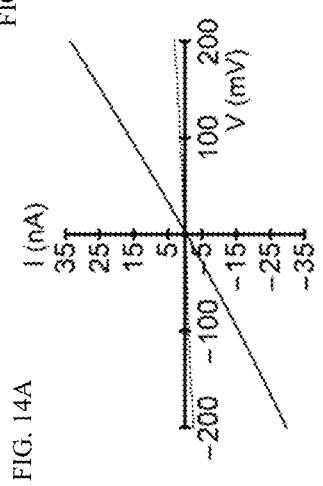

Current-voltage curves of the nanopore measured in 1 M KCl at pH ~7 before (solid trace) and after (dotted trace) surface functionalization with 3,5-bis(trifluoromethyl)phenyl isocyanate, as outlined above, are shown in FIG. 14A. A dramatic decrease in the slope is observed after the surface attachment reaction. Also, nanopore conductance (G) data at various surrounding electrolyte pH values were plotted out across a freshly formed silicon nitride nanopore before (FIG. 14B) and after (FIG. 14C) surface functionalization as outlined in FIG. 13. For comparison, a pH-conductance curve of a freshly fabricated silicon nitride nanopore treated with allyl amine (via hydrosilylation) and then with 3,5-bis (trifluoromethyl)phenyl isocyanate is included as FIG. 14D.

The data from this example showcase the versatility of direct surface functionalization method based on a dielectric-breakdown-based nanopore fabrication method according to principles of the present invention.

Example 3

In an embodiment of the invention, a freshly formed, silicon-rich nanopore in a silicon nitride or silicon chip fabricated via dielectric breakdown as described above is treated with $PCl_5$ for 20-60 min at 80-100° C. using benzoyl peroxide as a radical initiator in chlorobenzene, resulting in Si—Cl-terminated surfaces. Again, no preparatory acid treatment is needed before the surface functionalization.

Example 4

In other embodiments of the invention, a freshly formed nanopore-containing surface, silicon-enriched according to principles of the invention, are treated, respectively, with molecular chlorine, bromine, and iodine under nitrogen or argon, resulting in efficient Si—X (X is Cl, Br, and I, respectively) bond formation in about 30 minutes at room temperature. Again, no preparatory HF-treatment is needed before surface functionalization.

Subsequently, the Si—X surface can undergo further surface chemistry, e.g., as outlined in FIG. 15.

Example 5

In an embodiment of the invention, a silicon-rich surface, e.g., a hydrogen-terminated Si(111) surface, freshly formed following the dielectric breakdown method described above undergoes radical hydrosilylation, i.e., using a radical initiator (FIGS. 16A and 16B). The reaction is initiated in the presence of diacylperoxide, resulting in the R. radicals; the R. radical then abstracts a hydrogen atom from the silicon-rich surface, forming highly reactive silicon radical (FIG. 16A). When contacted with an alkene, the surface silicon radical reacts to form a Si—C bond (FIG. 16B). No preparatory acid etching is needed before surface functionalization.

Example 6

Figure 17:
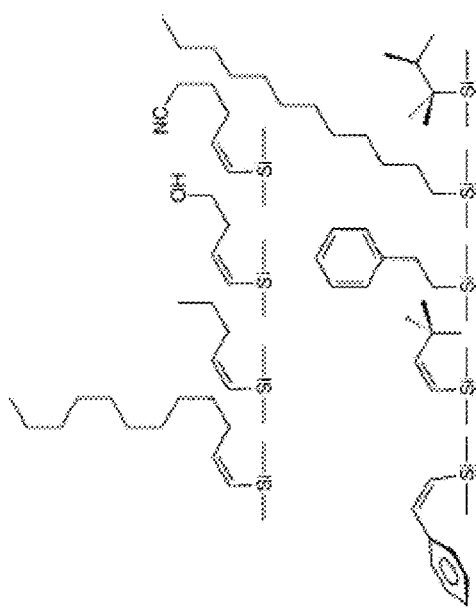
FIG. 17 outlines results for hydrosilylating a freshly formed, nanopore-containing silicon surface using Lewis-acid catalysts, according to an embodiment of the invention.

In another embodiment of the invention, a silicon-rich surface freshly formed following the dielectric breakdown method described above undergoes direct hydrosilylation using a Lewis acid as catalyst without any HF-etching. For example, using $AlCl_3$ or $EtAlCl_2$ as a Lewis acid catalyst, alkynes or alkenes are directly hydrosilylated onto pristine Si—H nanopore surfaces, resulting in functionalized surfaces shown in FIG. 17 with vinyl- and alkyl-terminal groups.

In other embodiment of the invention, other metal catalysts, e.g., platinum (0) complexes and colloids (e.g., Karstedt's catalyst) are employed. For example, using 3,4-dichlorobutene as the alkene reactant, and platinum(0)-divinyltetramethyldisiloxane as a catalyst precursor, chloride incorporation from the Cl-containing olefin onto the Si surface is confirmed through means such as mass spectrometry or XPS after 45 minutes at room temperature.

Other metal catalysts useful for the hydrosilylation process here include and are not limited to: Wilkinson's catalyst, i.e., $RhCl(PPh_3)_3$, and certain palladium complexes in the presence of alkynes.

Example 7

Figure 18:
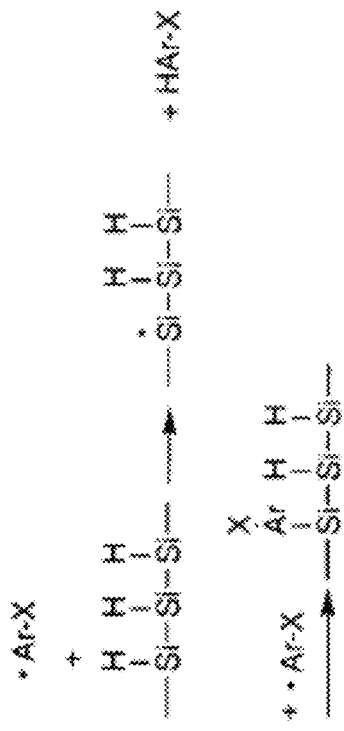
FIG. 18 outlines a mechanism for functionalizing a freshly formed, nanopore-containing silicon surface using electrochemical reaction conditions, according to an embodiment of the invention.

In another embodiment of the invention, a silicon-rich surface freshly formed following the dielectric breakdown method described above undergoes an electrochemical functionalization (FIG. 18). Specifically, the electrochemical diazonium reduction outlined in the figure leads to the formation of R. radicals; the R. radical then abstracts a hydrogen atom from a surface hydride, forming silicon radical. When it is contacted with another R. radical, the two combine to form a Si—C bond. No preparatory acid etching is needed before surface functionalization.

Example 8

Figure 19:
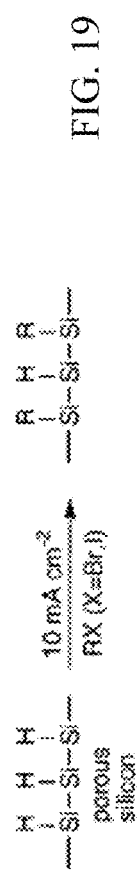
FIG. 19 outlines a mechanism for functionalizing a freshly formed, nanopore-containing silicon nitride surface using electrochemical reaction conditions, according to an embodiment of the invention.

In yet another embodiment of the invention, a silicon-rich surface freshly formed following the dielectric breakdown method described above undergoes an electrochemical reaction that attaches a terminal R group to the surface (FIG. 19). No preparatory acid etching is needed before surface functionalization.

Example 9

Figure 20:
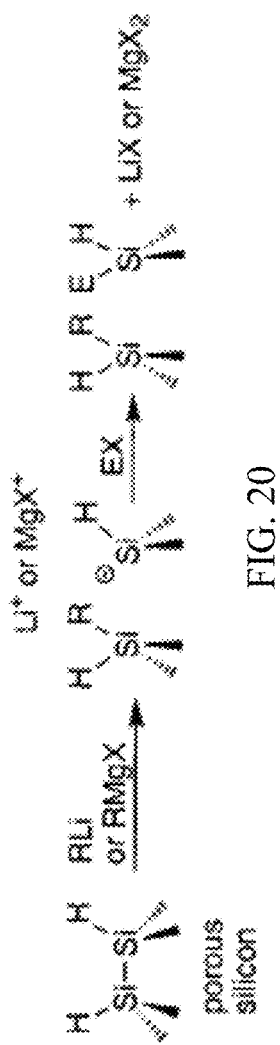
FIG. 20 outlines a mechanism for functionalizing a freshly formed, nanopore-containing silicon surface using carbanion addition, according to an embodiment of the invention.

In another embodiment of the invention, a silicon-rich surface freshly formed following the dielectric breakdown method described above undergoes surface functionalization using carbanion addition (FIG. 20). Specifically, an organolithium or Grignard reagents contacts a freshly formed silicon surface, e.g., Si(100) surface, leading to attack by the carbanion on the weak Si—Si bonds. The resulting silyl anion further reacts with an electrophile (EX). No preparatory acid etching is needed before surface functionalization.

Example 10

In yet another embodiment of the invention, a silicon-rich nanopore-containing and, preferably porous, silicon-hydride surface freshly formed following the dielectric breakdown method described above undergoes hydrosilylation using cathodic electrografting (CEG) (FIG. 21A), or anodic electrografting (AEG) (FIG. 21B). No preparatory acid etching is needed before surface functionalization.

While the present invention has been particularly shown and described with reference to the structure and methods disclosed herein and as illustrated in the drawings, it is not confined to the details set forth and this invention is intended to cover any modifications and changes as may come within the scope and spirit of the following claims. All publications and patent literature described herein are incorporated by reference in entirety to the extent permitted by applicable laws and regulations.

What is claimed is:

1. An etching-free method for hydrosilylating a silicon nitride surface, the method comprising sequential steps of:
    (a) placing a silicon nitride substrate in an electrolyte solution;
    (b) applying an electric potential across a section of the substrate that is no more than 100 nm in thickness until a nanopore of less than about 100 nm in diameter is formed across the section, the nanopore having freshly formed, silicon-rich silicon nitride surface lining its passageway; and
    (c) directly attaching a functional group onto the freshly formed silicon-rich silicon nitride surface inside the nanopore by contacting the surface with a reagent having at least one terminal, unsaturated bond, thereby covalently linking the functional group to the silicon on the surface to form a monolayer and such that the resulting nanopore is no more than 100 nm wide in diameter.

2. The etching-free method of claim 1, wherein the resulting nanopore is no more than 50 nm wide in diameter.

3. The etching-free method of claim 1, wherein the resulting nanopore is no more than 40 nm wide in diameter.

4. The etching-free method of claim 1, wherein the resulting nanopore is no more than 30 nm wide in diameter.

5. The etching-free method of claim 1, wherein the resulting nanopore is no more than 20 nm wide in diameter.

6. The etching-free method of claim 1, wherein the resulting nanopore is no more than 10 nm wide in diameter.

7. The etching-free method of claim 1, wherein the resulting nanopore is about 3-5 nm wide in diameter.

8. The etching-free method of claim 1, wherein step (c) comprises adding an alkene or alkyne to access the freshly formed silicon-rich silicon nitride surface inside the nanopore, thereby forming a Si—C bond on the surface.

9. The etching-free method of claim 1, wherein step (c) is carried out under a stimulus selected from the group consisting of photo-radiation, heat, electricity, a metal catalyst, a radical initiator, and a chemical catalyst.

10. The etching-free method of claim 1, further comprising an additional step of preventing the freshly formed, silicon-rich silicon nitride surface from any significant oxidization before step (c).

11. The etching-free method of claim 10, wherein the additional step comprises submerging the silicon nitride surface under a liquid.

12. The etching-free method of claim 1, further comprising, after the step (c), a step of attaching at least an additional functional group to the monolayer.

13. An etching-free method for hydrosilylating a silicon surface, the method comprising the steps of:
    a. placing a silicon substrate in an electrolyte solution;
    b. applying an electric potential across a section of the substrate that is no more than 100 nm in thickness until a nanopore of less than about 100 nm in diameter is formed across the section, the nanopore having freshly formed silicon surface lining its passageway; and
    c. directly attaching a functional group onto the freshly formed silicon surface inside the nanopore by contacting the surface with a reagent having at least one terminal, unsaturated bond, thereby covalently linking the functional group to the silicon on the surface to form a monolayer and such that the resulting nanopore is no more than 100 nm wide in diameter.

14. The etching-free method of claim 13, wherein the resulting nanopore is no more than 50 nm wide in diameter.

15. The etching-free method of claim 13, wherein the resulting nanopore is no more than 40 nm wide in diameter.

16. The etching-free method of claim 13, wherein the resulting nanopore is no more than 30 nm wide in diameter.

17. The etching-free method of claim 13, wherein the resulting nanopore is no more than 20 nm wide in diameter.

18. The etching-free method of claim 13, wherein the resulting nanopore is no more than 10 nm wide in diameter.

19. The etching-free method of claim 13, wherein the resulting nanopore is about 3-5 nm wide in diameter.

20. The etching-free method of claim 13, wherein step (c) comprises adding an alkene or alkyne to access the freshly formed silicon surface inside the nanopore, thereby forming a Si—C bond on the surface.

21. The etching-free method of claim 13, wherein step (c) is carried out under a stimulus selected from the group consisting of photo-radiation, heat, electricity, a metal catalyst, a radical initiator, and a chemical catalyst.

22. The etching-free method of claim 13, further comprising an additional step of preventing the freshly formed, silicon surface from any significant oxidization before step (c).

23. The etching-free method of claim 22, wherein the additional step comprises submerging the silicon surface under a liquid.

24. The etching-free method of claim 13, further comprising, after the step (c), a step of attaching at least an additional functional group to the monolayer.

25. An etching-free method for functionalizing a silicon nitride surface, the method comprising the steps of:
   a. placing a silicon nitride substrate in an electrolyte solution;
   b. applying an electric potential across a section of the substrate that is no more than 100 nm in thickness until a nanopore of less than about 100 nm in diameter is formed across the section, the nanopore having a freshly formed, silicon-rich silicon nitride surface lining its passageway; and
   c. directly attaching an isocyanate-terminated species onto the freshly formed silicon-rich silicon nitride surface inside the nanopore by contacting the surface with a reagent having a terminal isocyanate group, thereby covalently linking the isocyanate group to the nitrogen on the surface via click chemistry to form a monolayer, and such that the resulting nanopore is no more than 100 nm wide in diameter.

26. The etching-free method of claim 25, wherein the reagent is 3,5-bis(trifluoromethyl)phenyl isocyanate.

* * * * *